(12) United States Patent
Glück et al.

(10) Patent No.: US 7,452,443 B2
(45) Date of Patent: Nov. 18, 2008

(54) VACUUM PLASMA GENERATOR

(75) Inventors: Michael Glück, Freiburg (DE);
Christoph Hofstetter, Teningen (DE);
Gerd Hintz, Pfaffenweiler (DE)

(73) Assignee: HUETTINGER Elektronik GmbH + Co. KG, Freiburg (DE)

( * ) Notice: Subject to any disclaimer, the term of this patent is extended or adjusted under 35 U.S.C. 154(b) by 310 days.

(21) Appl. No.: 11/371,628

(22) Filed: Mar. 9, 2006

(65) Prior Publication Data

US 2006/0196426 A1    Sep. 7, 2006

Related U.S. Application Data

(63) Continuation-in-part of application No. 11/368,314, filed on Mar. 3, 2006.

(60) Provisional application No. 60/675,854, filed on Apr. 29, 2005, provisional application No. 60/675,852, filed on Apr. 29, 2005.

(30) Foreign Application Priority Data

Mar. 5, 2005  (EP)  ................... 05004860
Mar. 10, 2005 (EP)  ................... 05005248

(51) Int. Cl.
*C23F 1/00* (2006.01)
*H01L 21/306* (2006.01)
(52) U.S. Cl. ............... 156/345.35; 156/345.38; 156/345.44; 156/345.48
(58) Field of Classification Search ............ 156/345.1, 156/345.35, 345.38, 345.44, 345.48
See application file for complete search history.

(56) References Cited

U.S. PATENT DOCUMENTS 4,499,441 A    2/1985   Lynch et al.
4,701,716 A    10/1987  Poole (Continued)

FOREIGN PATENT DOCUMENTS

EP        0 456 212       10/1996

(Continued)

OTHER PUBLICATIONS

European Search Report from priority application EP 05 00 5248, issued Sep. 8, 2005.

(Continued)

*Primary Examiner*—Duy-Vu N Deo
(74) *Attorney, Agent, or Firm*—Fish & Richardson P.C.

(57) ABSTRACT

A vacuum plasma generator is used for treating workpieces in a vacuum chamber. The vacuum plasma generator includes a mains connection for connection to a voltage supply network, and at least one mains rectifier. The at least one mains rectifier is connected to at least one first converter that generates at least one intermediate circuit voltage, a first RF signal generator, a second RF signal generator, and at least one 3 dB coupler. The first RF signal generator is connected to at least one intermediate circuit voltage, for generating a first signal of a basic frequency and of a first phase position. The second RF signal generator is connected to at least one intermediate circuit voltage, for generating a second signal of the basic frequency and of a second phase position. The least one 3 dB coupler couples the first and the second signal into an output signal of the generator.

23 Claims, 9 Drawing Sheets

U.S. PATENT DOCUMENTS

| | | | |
|---|---|---|---|
| 5,747,935 A | | 5/1998 | Porter et al. |
| 6,703,080 B2* | | 3/2004 | Reyzelman et al. ......... 427/445 |
| 7,166,816 B1* | | 1/2007 | Chen et al. ............ 219/121.41 |
| 2001/0026575 A1 | | 10/2001 | Sato et al. |
| 2003/0025573 A1 | | 2/2003 | Pchelnikov et al. |
| 2003/0215373 A1 | | 11/2003 | Reyzelman et al. |
| 2004/0032212 A1 | | 2/2004 | Yuzurihara et al. |
| 2004/0207482 A1 | | 10/2004 | McAndrew et al. |
| 2004/0222184 A1 | | 11/2004 | Hayami et al. |
| 2005/0093459 A1* | | 5/2005 | Kishinevsky ........... 315/111.21 |

FOREIGN PATENT DOCUMENTS

| | | |
|---|---|---|
| EP | 0 731 559 | 11/2001 |
| KR | 20030002509 | 1/2003 |
| WO | WO 03/079397 | 9/2003 |

OTHER PUBLICATIONS

Notice of Decision for Patent for corresponding Korean Application No. 10-20006-0022082; mailed Nov. 29, 2007, 1 page.

* cited by examiner

VACUUM PLASMA GENERATOR

CROSS REFERENCE TO RELATED APPLICATION

This application claims priority under 35 U.S.C. §119 to EP 05 005 248.9, filed on Mar. 10, 2005, and to U.S. Application No. 60/675,854, filed Apr. 29, 2005. This application is a continuation-in-part of a U.S. Application No. 11/368,314, filed on Mar. 3, 2006, titled "3 dB Coupler", which claimed priority to EP 05 004 860.2, filed Mar. 5, 2005 and to U.S. Application No. 60/675,852, filed Apr. 29, 2005. All of these applications are hereby incorporated by reference in their entirety.

TECHNICAL FIELD

The application relates to a vacuum plasma generator for treating workpieces in a vacuum chamber.

BACKGROUND

Vacuum plasma generators are used, for example, in semiconductor production for coating and etching. Semiconductor production processes may require a radio-frequency (RF) power in the range from 1 to 30 MHz and a power of several kW. Plasma loads, i.e., plasma processes in a vacuum chamber, are highly dynamic and tend to cause arcing, which causes mismatching and hence reflections in RF applications.

Most vacuum plasma generators include at least one amplifier for generating a high-energy RF signal. In the case of mismatching, the energy is reflected by the load. Part (usually a very small part) of the reflected energy is absorbed in the amplifier of the vacuum plasma generator and converted into heat. Much of the energy can be reflected by the amplifier, thus producing multiple reflections and thereby standing waves. This can produce very large amounts of energy that oscillates between the amplifier and the plasma load and can cause damage both to the plasma load and to the amplifier.

U.S. Pat. No. 6,703,080 B2 discloses a vacuum plasma generator that can be connected to a switching power supply and is connected to a driver stage. The driver stage supplies an RF signal to an amplifier stage, where the RF signal is initially divided onto several paths, is subsequently amplified in the paths, and is finally coupled again in a 3 dB coupler to form an amplified RF signal. An insulating stage having a circulator is provided to decouple the amplifier stage from the load impedance changes.

Vacuum plasma generators should have a size that enables them to be mounted close to the vacuum chambers to avoid the need for long expensive cables.

Moreover, in semiconductor production, vacuum plasma generators additionally meet clean room requirements. Forced air exchange between the inside of the generators and the ambient air using ventilators is not desired. Vacuum plasma generators are often designed to be used in different countries having different mains voltages and frequencies. They are mainly used in industry where they must meet high demands as regards interference resistance, wherein at the same time high interference voltages are mostly present in the current supply networks and at the load.

SUMMARY

A vacuum plasma generator is operated with reduced loss and is much less susceptible to external disturbances, and the vacuum plasma generator is designed with a low number of components and has a small size and offers versatile use (in as many countries and fields of use as possible).

In one general aspect, the vacuum plasma generator includes a mains connection for connection to a voltage supply network, and at least one mains rectifier. The at least one mains rectifier is connected to at least one first converter for generating at least one intermediate circuit voltage, a first RF signal generator, a second RF signal generator, and at least one 3 dB coupler. The first RF signal generator is connected to at least one intermediate circuit voltage of the at least one first converter, for generating a first signal of a basic frequency, in particular, in the range between 1 and 30 MHz, and of a first phase position. The second RF signal generator is connected to an intermediate circuit voltage of the at least one first converter, for generating a second signal of the basic frequency, and of a second phase position. The at least one 3 dB coupler couples the first and the second signal into an output signal, transferring it indirectly or directly to a generator output.

Implementations may include one or more of the following features. For example, the first and second RF signal generators each may be designed as inverters that are driven by a control means. The control means may be open-loop, closed-loop, or both open-loop and closed-loop. Each inverter may include a half-bridge or a full bridge.

The generator may further include at least one capacitor for galvanic decoupling. The generator may further include a pulse shaping network that is connected downstream of each of the first and second RF signal generators.

The 3 dB coupler may include at least one first and one second electric conductor that are spaced apart and are capacitively and inductively coupled to each other. The first conductor may represent the primary side of a transformer and the second conductor may represent the secondary side of a transformer. The first and second conductors each may have a winding number of n>1. The length of the at least one first and/or one second conductor may be $<\lambda/4$, where $\lambda$ is a wavelength of the RF signal.

The 3 dB coupler may include at least one first and one second electric conductor that are spaced apart, and are capacitively and inductively coupled to each other. The first conductor may represent the primary side of a transformer and the second conductor may represent the secondary side of a transformer. At least one inductance increasing element may be provided in a coupling region to increase the inductance of the conductors. The length of the at least one first and/or second conductor may be $<\lambda/4$.

The 3 dB coupler may have a characteristic wave impedance of <50 ohms. The 3 dB coupler may have a characteristic wave impedance of <20 ohms.

The generator may include at least two converters to generate intermediate circuit voltages, wherein each converter would be associated with at least one RF signal generator.

The generator may include a control means. The control means may be open-loop, closed-loop, or both open-loop and closed-loop. The at least one converter may include an input connected to the open-loop and/or closed-loop control means. The open-loop and/or closed-loop control means may be designed as a programmable logic component. The open-loop and/or closed-loop control means may be a digital signal processor. The generator may include an impedance matching circuit that adjusts the impedance of the generator to a plasma load.

The at least one converter may be designed as a boost converter, a buck converter, or both a boost and a buck converter.

The first RF signal generator may generate a first signal of the basic frequency in the range between 1 and 30 MHz.

One advantage of the mains rectifier and the converter is the insensitivity to disturbances from the mains. In particular, it is possible to compensate for temporary power failure and/or mains voltage reduction with a controlled intermediate circuit voltage. Such compensation is beneficial for those generators used, for example, in the production of semiconductors.

The voltage supply network that feeds into the mains connection may be an alternating voltage network of different frequencies when a mains rectifier is used. The voltage supply network may be a direct voltage network. In particular, in a direct voltage network, an inverse-polarity protection is integrated through the mains rectifier.

The 3 dB coupler is a quadruple gate causing a 45° phase shift in the ideal case when the signal traverses the 3 dB coupler. In reality, there are deviations of a few degrees due to the transit time. When two RF signals enter gates A and B of the 3 dB coupler with a phase shift of 90°, one RF signal will be phase-shifted by +45° on its way to gate C and the other signal will be phase-shifted by −45°, so that the signals of the first and second RF signal generators supplied to gate A and B, respectively, are cancelled at gate C. There is no power at gate C. The combined power of the two RF signal generators appears at gate D, since the signals of the first and second signal generators are phase-shifted by −45° and +45°, respectively, in the 3 dB coupler, and consequently are in phase at gate D. When a load compensation resistance is provided at gate C, no power is consumed at that location and 100% of the power is transferred to the plasma load connected to gate D.

The 3 dB coupler has an advantage over other couplers. The 3 dB coupler splits the reflected power into two paths that are returned to the RF signal generators. The amplitude of the reflected signal is the same in both paths, the signals, however, are 90° phase-shifted. When the RF signal generators to be combined have the same construction, their reflection factors are also the same. The power reflected by the load is thereby reflected again by the RF signal generators. Due to phase rotation during reflection, the reflected power is not returned to the load but is transferred to the load compensation resistance at gate C. If the latter is terminated with an absorber resistance $R=Z_0$=characteristic wave impedance, the power reflected by the load is completely consumed in the absorber resistance and not reflected again. The reflected RF signals cancel each other at gate D. This is one of the advantages of combining two RF signal generators through a 3 dB coupler. Multiple reflections are eliminated or substantially reduced.

The 3 dB coupler thereby forms a protective circuit that prevents destruction of the connected RF signal generators in case of reflections due to different load conditions, thereby permitting safe operation of transistorized RF signal generators also in such applications.

Impedance changes of the load consequently only have little effect on the stability of the vacuum plasma generator. The vacuum plasma generator is further characterized by its relatively simple construction. In particular, the vacuum plasma generator need not include a splitter to initially divide the RF power into at least two paths. Moreover, the vacuum plasma generator need not include a circulator. The fact that the second RF signal generator can be connected to the same intermediate circuit voltage is also advantageous.

In one implementation, the first and second RF signal generators may each be designed as inverters that are driven by an open-loop control means, a closed-loop control means, or both an open-loop control means and a closed-loop control means. The phase adjustment of the inverter output signal can be facilitated, for example, through suitable driving of the inverter. This renders phase adjustment particularly flexible. Phase differences that are generated when the signal paths containing the different inverters have different lengths can be compensated for in a simple manner. Moreover, the inverters can be operated as amplifiers. The frequency of the radio-frequency signals, in particular radio-frequency alternating voltages, can be changed through suitable driving. The adjusted phase position can then substantially be maintained. The frequency variation is advantageous when the impedance of the vacuum plasma generator is to be matched to the impedance of the plasma without changing the impedance matching network.

RF plasma processes are often operated with fixed impedance matching networks that cannot be dynamically regulated, so-called fix match arrangements. In such arrangements, the basic frequency is varied within predetermined limits to match the impedance. The remaining mismatching is accepted, which, in conventional vacuum plasma generators, produces multiple reflections. As discussed above, the vacuum plasma generator described herein reduces or eliminates multiple reflections.

The inverters may include at least one switching element each, and the switching element is switched on and off at a basic frequency. The switching element may be a transistor, for example, a MOS-FET transistor.

The closed loop and/or open loop control means may have one synchronously driven control output for each inverter for amplitude modulation, in particular, for pulsing the RF power. Amplitude modulation, for example, pulsing, may be used in modern vacuum plasma processes. The load changes, in particular dynamically, during amplitude modulation and mainly during pulsing. In most cases, impedance matching may not be possible with the pulse frequency. The pulse frequency is often in a range between 100 Hz and 100 kHz. Impedance matching at these frequencies is not possible since impedance matching networks react too slowly, i.e., reflections are produced. The vacuum plasma generator reduces or prevents multiple reflections and in particular, also reduces or prevents the reflected power that is reflected back to the plasma process.

The operating behavior of inverters can be disturbed by reflected power. In particular, in circuits having a pulse shaping network downstream of the inverters that is designed to operate the switching elements with minimum loss (switching on when a minimum voltage is applied at the switching element), reflections, and, in particular multiple reflections, can disturb the inverters. Thus, a 3 dB coupler renders operation of these inverter circuits more safe. The power of such inverter circuits may be controlled by controlling the intermediate circuit voltage. In this case, particularly low-loss and easily realizable inverters can be used, for example, those including only one switching element.

In another implementation, the inverters may each include a half- or a full-bridge. The power of bridge circuits can be controlled using pulse width modulation or phase shift modulation. Power control using the intermediate voltage is then not required.

The power at the generator output can also be controlled using phase differences between the two inverters. When the signals of the inverters are not phase-shifted by 90°, only part of the power is guided to the generator output and the other part is guided to the load compensation resistance. This provides very fast power control.

In one implementation, one pulse shaping network is connected downstream of each of the first and the second RF signal generator. A rectangular signal or a digital signal is provided at each inverter output. This signal can be converted into a sinusoidal signal by a pulse shaping network. It is thereby possible to filter harmonics, and the switching elements of the inverters can be switched with extremely little loss. Advantageously, the pulse shaping network may be substantially matched to the basic frequency. Further inverters with downstream pulse shaping networks may be provided. Moreover, further 3 dB couplers may be provided that couple the radio-frequency signals like cascades, for example, couple them to an output connection of the vacuum plasma generator.

When the inverter (or inverters), the pulse shaping networks, or the 3 dB coupler are galvanically decoupled at their outputs by way of capacitors, transformers for galvanic decoupling can be omitted.

In one implementation, the 3 dB coupler includes at least one first and one second electric conductor that are spaced apart from each other and are capacitively and inductively coupled, wherein the first conductor represents the primary side and the second conductor represents the secondary side of a transformer including a coupling inductance, and the first and second conductors each have a winding number of n>1. The inductance may be increased by increasing the number of windings. The inductance (coupling inductance) is squared with the number of windings. By doubling the winding number, the inductance increases by a factor of four. The size of an inductance increasing element may therefore decrease by a factor of 4 if the winding number is doubled. The size can be reduced by using more than one winding. With a sufficiently high winding number, no further inductance-increasing actions are required in the ideal case. The 3 dB coupler may thereby be operated at frequencies <100 MHz, i.e., at considerably smaller frequencies.

In an alternative or additional method of increasing the inductance, the 3 dB coupler may include at least one inductance increasing element in a coupling region to increase the inductance of the conductors. The inductance increasing element may have any suitable shape. It may surround at least part of the conductors in the coupling region. It may, for example, be parallel thereto which obtains a particularly simple and effective coupling. The inductance increasing element may surround the conductors in the coupling region, and may be in the shape of a ring. Ring-shaped thereby means that the conductor sections in the coupling region are surrounded by a substantially closed geometry, which may be circular, elliptic, rectangular, etc. An annular geometry may be used to reduce stray fields. The inductance-increasing element may be designed as ferrite.

The capacitive coupling using a coupling capacitance may be realized by two spaced apart electric conductors having a defined surface and a defined separation from each other, in an inexpensive manner and with high reproduction precision.

One obtains a compact arrangement that provides at the same time capacities that can be easily reproduced by designing the conductors as flat strip conductors at least in the coupling region.

The coupling capacitance and inductance are realized with particular preference using flat strip conductors that are disposed on board material. The board material advantageously has a low loss factor tan δ. tan δ should be smaller than 0.005 to reduce the loss in the dielectric material. First experiments have shown that RT/duorit 5870 from ROGERS Corp. is suitable, having a tan δ of 0.0005-0.0012 and an $\epsilon_r$ of 2.3.

The 3 dB coupler can be realized with reduced or minimum expense by realizing the strip conductors in a multilayer board.

In one implementation, the length of the at least one first and/or second conductor of the 3 dB coupler is <λ/4, preferably <λ/8, with particular preference <λ/10. At these values, the transmission line theory of radio-frequency technology is not as relevant. The 3 dB coupler is not a line coupler for higher frequencies, i.e., the characteristic of the 3 dB coupler is not (exclusively) determined by the line length. The coupling between the electric conductors corresponds rather to a capacitive coupling with a fixed given and adjusted capacitance between the conductors with a predetermined basic frequency f and a predetermined characteristic wave impedance $Z_0$. The capacitance may be adjusted by adjusting the surface and the separation between the conductors. The coupling moreover corresponds to an inductive coupling with a fixed given and adjusted inductance of the transformer with predetermined basic frequency f and predetermined characteristic wave impedance $Z_0$. The inductance is adjusted, for example, in dependence on the length of the conductors, in particular, of the conductor sections. In one implementation, at least one inductance increasing element is provided in the coupling region to increase the inductance of the conductors.

The dimensions of the 3 dB coupler as a unit may be smaller than λ/10. The 3 dB coupler may be smaller than 20 cm×10 cm×10 cm at frequencies between 1 and 30 MHz and powers of up to 12 kW, which permits integration of the 3 dB coupler in currently conventional small housing shapes of the vacuum plasma generators.

The 3 dB coupler may be coupled to a coolant cooling system. Expensive air cooling that is susceptible to disturbances is not necessary. The overall vacuum plasma generator may be cooled by a coolant without forced air exchange between the inside of the vacuum plasma generator and the ambient air, for example, by way of a ventilator. Forced air movement in the inside of the vacuum plasma generator is thereby possible, wherein heat can be transported from the air into the coolant by way of heat exchangers.

To realize the desired behavior of the 3 dB coupler, the coupling inductance of the transformer and the coupling capacitance meets the following conditions:

$$L_K = Z_0/(2\pi f)$$

$$C_K = 1/(2\pi f Z_0)$$

wherein:
$L_K$=coupling inductance
$C_K$=coupling capacitance
$Z_0$=characteristic wave impedance
f=frequency At 13 MHz and $Z_0$=50 Ω, one obtains a coupling inductance $L_K$ of approximately 600 nH and a coupling capacitance $C_K$ of approximately 200 pF.

Vacuum plasma generators are usually provided with an output resistance of 50 ohms, since this is the common value for connecting components and cables. Since the 3 dB coupler is used in the inside of the vacuum plasma generator, it can also be realized with lower characteristic wave impedances. When the 3 dB coupler has a characteristic wave impedance of <50 ohms, preferably <20 ohms, it may be smaller, since smaller inductance-increasing elements are required. When the load impedance is <50 ohms, the impedance matching network may possibly be omitted. If impedance matching is required, an impedance matching network is provided to match the impedance of the generator to the plasma load. The impedance matching network may be disposed in the vacuum plasma generator or directly at the vacuum chamber. In the first case, the output signal of the 3 dB coupler is indirectly transmitted to the generator output, i.e., through the impedance matching network.

At least two converters may be provided for generating intermediate circuit voltages, wherein each converter is associated with at least one RF signal generator and permits individual regulation or control of each intermediate circuit voltage.

When the at least one converter includes an input for connecting a control means and when the converter can be controlled and/or regulated, the intermediate circuit voltage can be precisely adjusted. The control means may be open-loop, closed-loop, or both open-loop and closed-loop. The intermediate circuit voltage may, in particular, be open-loop and/or closed-loop controlled to a constant voltage value.

The open-loop and/or closed-loop control means may be designed as a programmable logic component, in particular, as a digital signal processor (or DSP). The inverters (RF signal, phase difference of the RF signals) and the converters (intermediate circuit voltages) may be open-loop and/or closed-loop controlled using a structural component, in particular, a programmable logic component, preferably one single DSP.

In one implementation, the at least one converter is designed as a boost converter, a buck converter, or both a boost converter and a buck converter. For this reason, a voltage of 200V to 400V can be set at their outputs. The mains voltage differs from country to country. The converter can be connected to mains voltages in a range from 200V to 400V. A constant or closed-loop controlled intermediate circuit voltage of 300V uses both a boost and a buck converter.

Mains rectifiers, converters, RF signal generators, 3 dB couplers, and, if necessary, pulse shaping network and control may be integrated in a metal housing. In this case, the vacuum plasma generator is particularly insensitive to interference radiation and can be operated with particularly good stability. The construction may furthermore be particularly compact.

The vacuum plasma generator may include a mains filter that renders the vacuum plasma generator particularly insensitive to interferences and harmonics from the network and permits even more stable operation thereof.

The vacuum plasma generator may include a protective circuit for protection against excess voltages from the mains and with particular preference also a protective circuit for protection against excess voltages from the generator output, which renders operation of the vacuum plasma generator even more stable.

Further features and advantages can be extracted from the following description, from the figures, and from the claims. The individual features may be realized individually or collectively in arbitrary combination.

DESCRIPTION OF DRAWINGS

Like reference symbols in the various drawings may indicate like elements.

DETAILED DESCRIPTION

Figure 1:
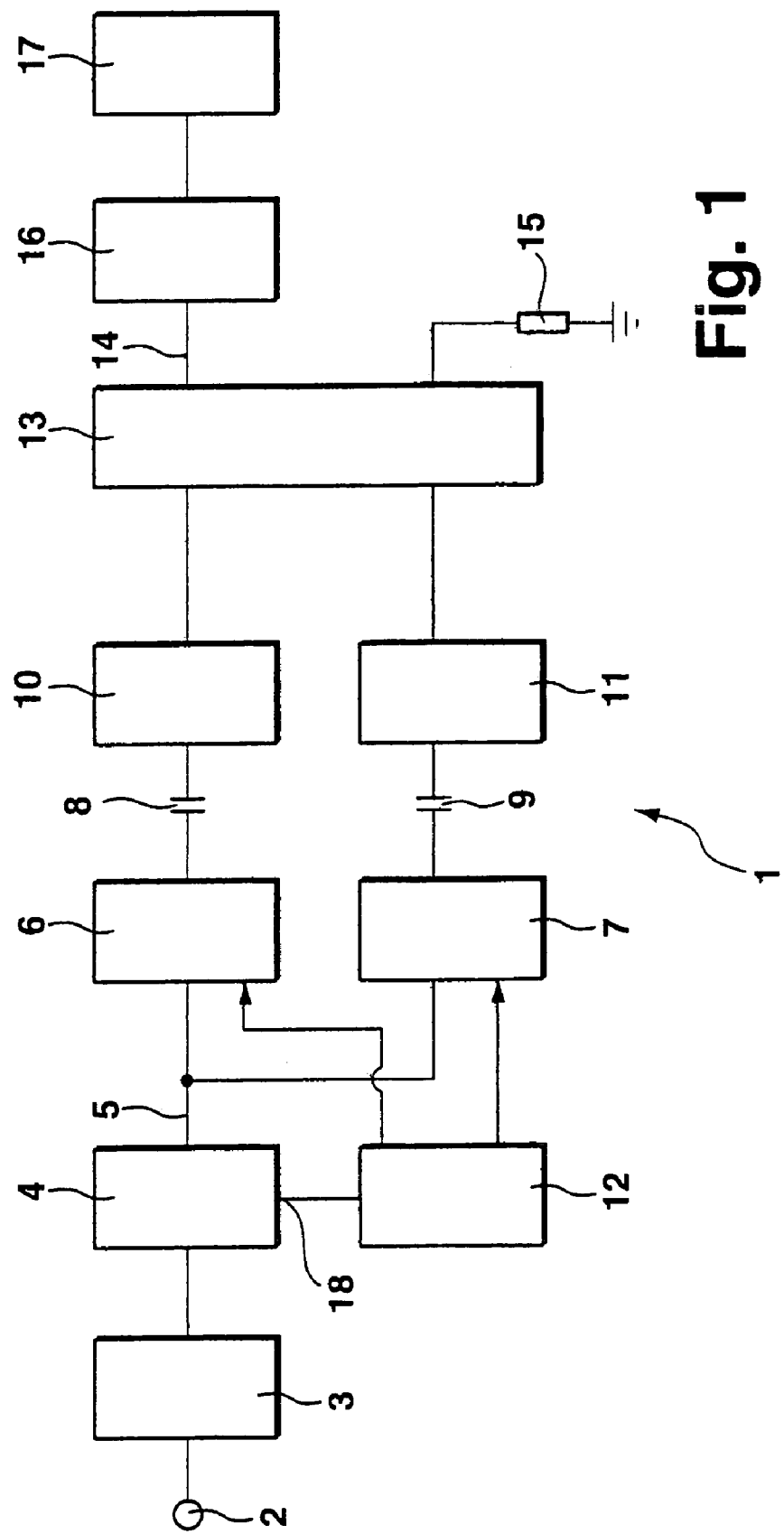
FIG. 1 shows a diagram of a first implementation of a vacuum plasma generator.

FIG. 1 shows a vacuum plasma generator 1 for treating workpieces in a vacuum chamber 17. The vacuum plasma generator 1 includes a mains connection 2 that supplies a mains voltage to a mains rectifier 3. A mains filter and a protective circuit for protection against excessive voltages from the mains may be integrated upstream or downstream of the mains rectifier 3. The DC voltage generated in the mains rectifier 3 is supplied to a converter 4 that generates an intermediate circuit voltage 5. The converter 4 may, for example, be designed as a DC/DC converter. The intermediate circuit voltage 5 is supplied to a first RF signal generator 6 and a second RF signal generator 7. The RF signal generators 6, 7 are designed as inverters in this implementation. The RF signal generators 6, 7 are connected to pulse shaping networks 10, 11 through, respective capacitors 8, 9. A control means 12 is connected to the RF signal generators 6, 7, and the control means 12 controls the RF signal generators 6, 7. The control means 12 may be open-loop, closed-loop, or both open-loop and closed-loop. The amplitude and the phase of the output signals of the RF signal generators 6, 7 can be adjusted using the open-loop and/or closed-loop control means 12. It is moreover possible to adjust the frequency of the output signals of the RF signal generators 6, 7 using the open-loop and/or closed-loop control means 12, which is designed as logic component. The output of the pulse shaping networks 10, 11 feeds a 3 dB coupler 13, which produces an output 14 that feeds the load, that is, the vacuum chamber 17. The 3 dB coupler 13 also includes a second output to which a compensation resistance 15 is coupled to ground. The phase position of the output signals of the RF signal generators 6, 7 can be adjusted such that the signals applied to the 3 dB coupler 13 are phase-shifted by 90°. This improves the power coupling at the output 14 of the 3 dB coupler 13. In the case of optimum phase position and matched load, no energy is consumed at the load compensation resistance 15. To match the impedance, an impedance matching network 16 may be connected between the 3 dB coupler 13 and the vacuum chamber 17.

The closed-loop and/or open-loop control means 12 is also connected to a control input 18 of the converter 4 to permit adjustment of the intermediate circuit voltage 5.

A protective circuit for protection against excess voltages from the output of the generator 1 can be disposed directly at the generator output 14 or in the progression of the signal generating paths 6, 8, 10 or 7, 9, 11, depending on where the protection is most effective or on the position of the components that are most sensitive to excess voltages.

Figure 2:
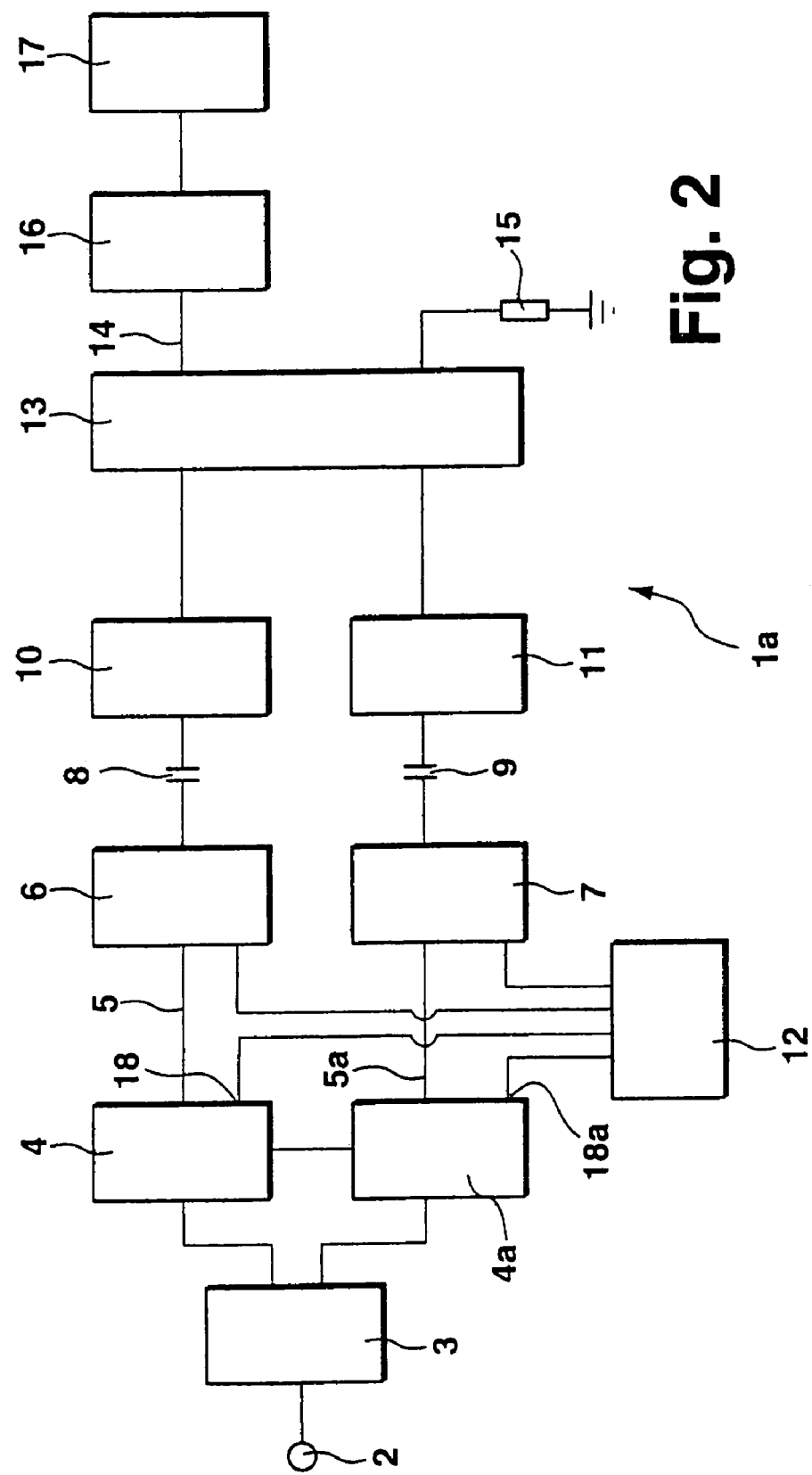
FIG. 2 shows a diagram of a second implementation of a vacuum plasma generator.

In contrast to FIG. 1, FIG. 2 has two converters 4, 4a that each generate an intermediate circuit voltage at positions 5, 5a. In FIG. 2, elements having the same function as elements in FIG. 1 have the same reference numerals. The open-loop and/or closed-loop control means 12 correspondingly controls the converters 4 and 4a. The closed-loop and/or open-loop control means 12 is represented as one unit. It is, however, also feasible to divide the closed-loop and/or open-loop control unit 12 into control components that are responsible for the converters 4, 4a and also for the RF signal generators 6, 7. It is also feasible to provide several separate open-loop and/or closed-loop control means.

Figure 3:
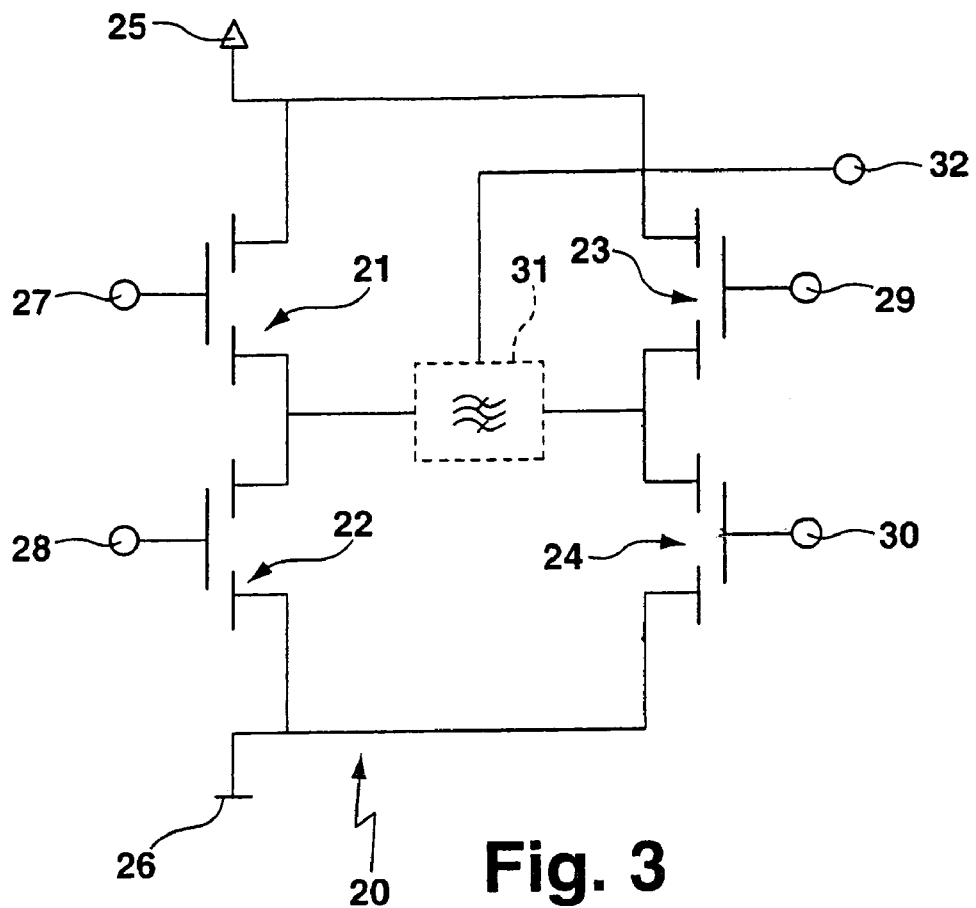
FIG. 3 shows a diagram of an inverter designed as a full bridge and including a pulse shaping network.

FIG. 3 shows an RF signal generator 20 designed as inverter and including a full bridge. The full bridge consists of four switching elements 21 to 24 that may be designed as MOS-FET transistors. The RF signal generator 20 is connected to the positive intermediate circuit voltage through a terminal 25 and to the negative intermediate circuit voltage or to the lower potential of the intermediate circuit voltage through a terminal 26. The switching elements 21 to 24 have connections 27 to 30, respectively, that represent the control connections of the switching elements 21 to 24. A pulse shaping network 31 is connected to the full bridge, and the pulse shaping network 31 can act as a bandpass filter and include an RF signal output 32. In one implementation, the pulse shaping network 31 includes a lowpass filter having several LC members, and does not act as a bandpass filter.

Figure 4:
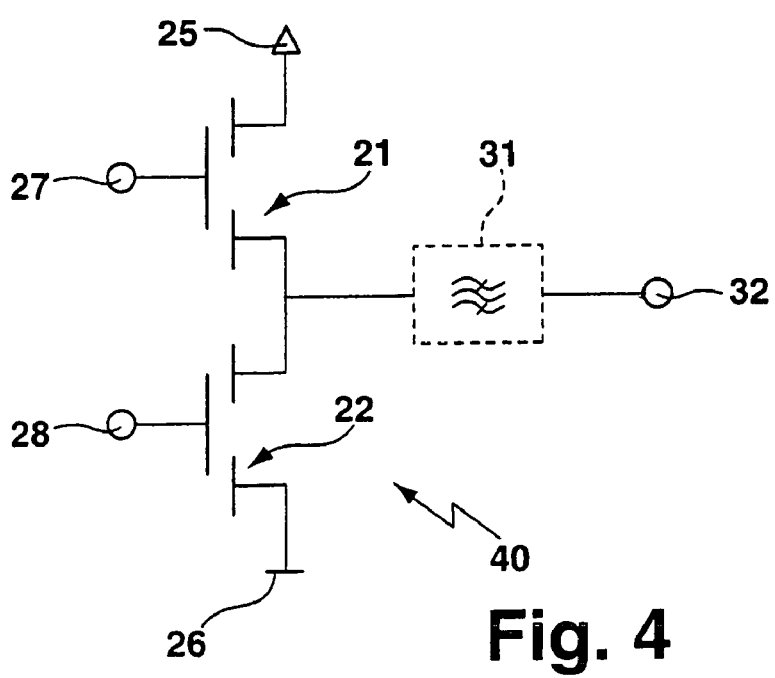
FIG. 4 shows a diagram of an inverter designed as a half-bridge and including a pulse shaping network.

FIG. 4 shows an RF signal generator 40 designed as inverter and including a half-bridge. The half-bridge includes two switching elements 21, 22 that may be designed as MOS-FET transistors and are connected in series. The switching elements 21, 22 also include respective connections 27, 28 used as control inputs. The RF signal generator 40 can also be connected to the intermediate circuit voltage through connections 25, 26. The RF signal generator 40 supplies a radio-frequency signal to the RF signal output 32 through the pulse shaping network 31.

Figure 5:
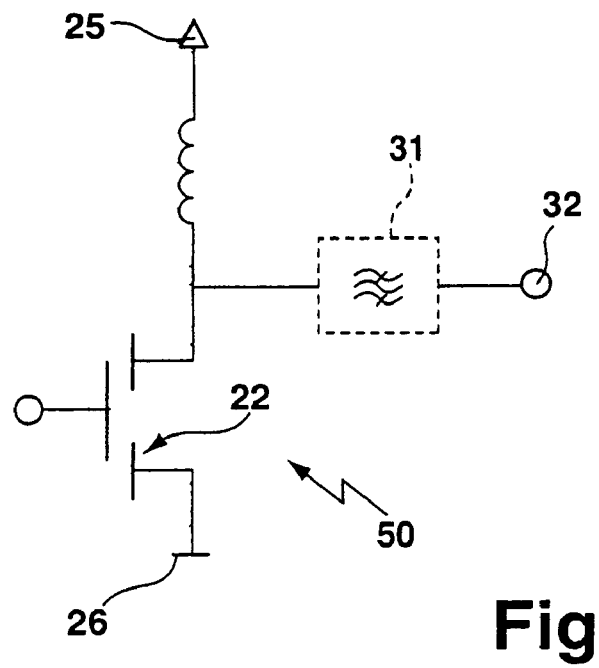
FIG. 5 shows a diagram of an inverter having a switching element.

Referring to FIG. 5, an RF signal generator 50 designed as inverter can be connected to an intermediate circuit voltage through terminals 25, 26. The RF signal generator 50 has a switching element 27 that may be designed as a MOS-FET transistor. The RF signal generator 50 supplies a radio-frequency signal to the RF signal output 32 through the pulse shaping network 31. The RF signal generator 50 is also known as a class E amplifier.

Figure 6:
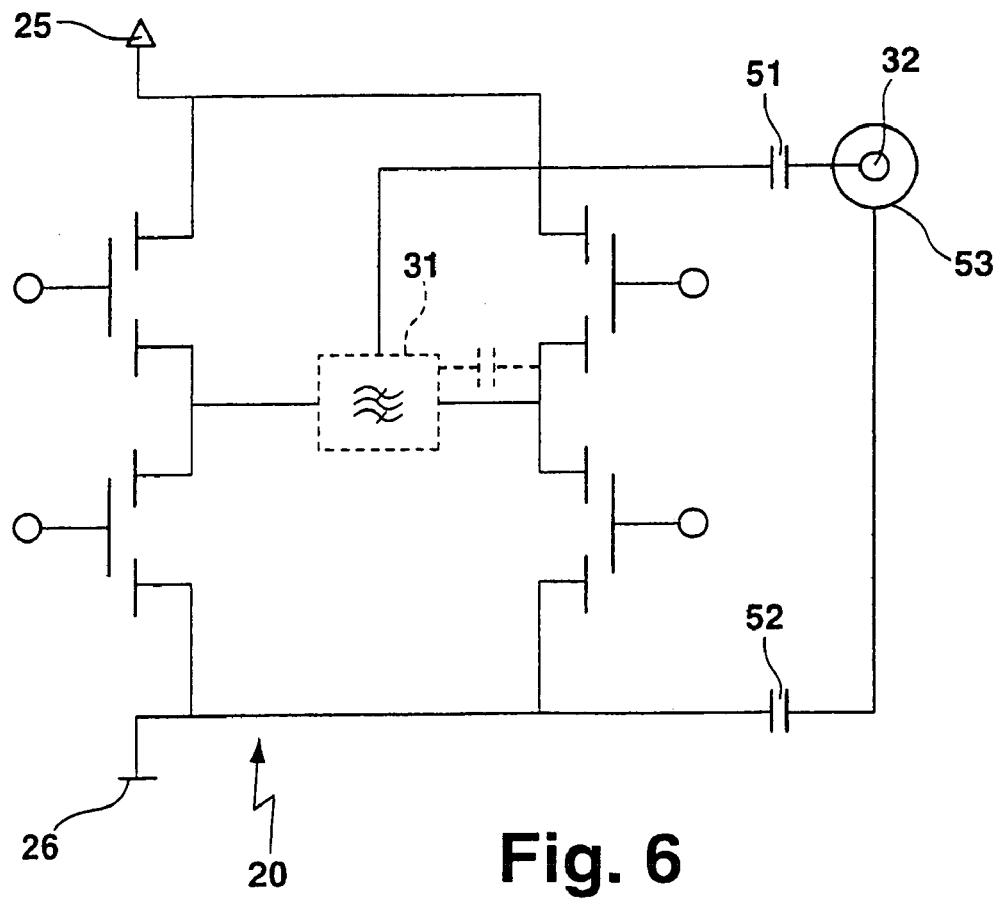
FIG. 6 shows a diagram of an inverter designed as full bridge and including decoupling capacitors.

FIG. 6 substantially shows again the RF signal generator 20 that is connected to a pulse shaping network 31. Capacitors 51, 52 are provided for galvanic decoupling. The capacitor 51 is connected between the pulse shaping network 31 and the RF signal output 32. The capacitor 52 is connected between the terminal 26 and the ground connection 53 of the generator. An additional capacitor (not shown in FIG. 6) can be included between the connection 25 and the ground connection 53. In one implementation of the circuit of FIG. 6, the pulse shaping network 31 is not realized as bandpass filter but as a lowpass filter having several LC members.

Figure 7:
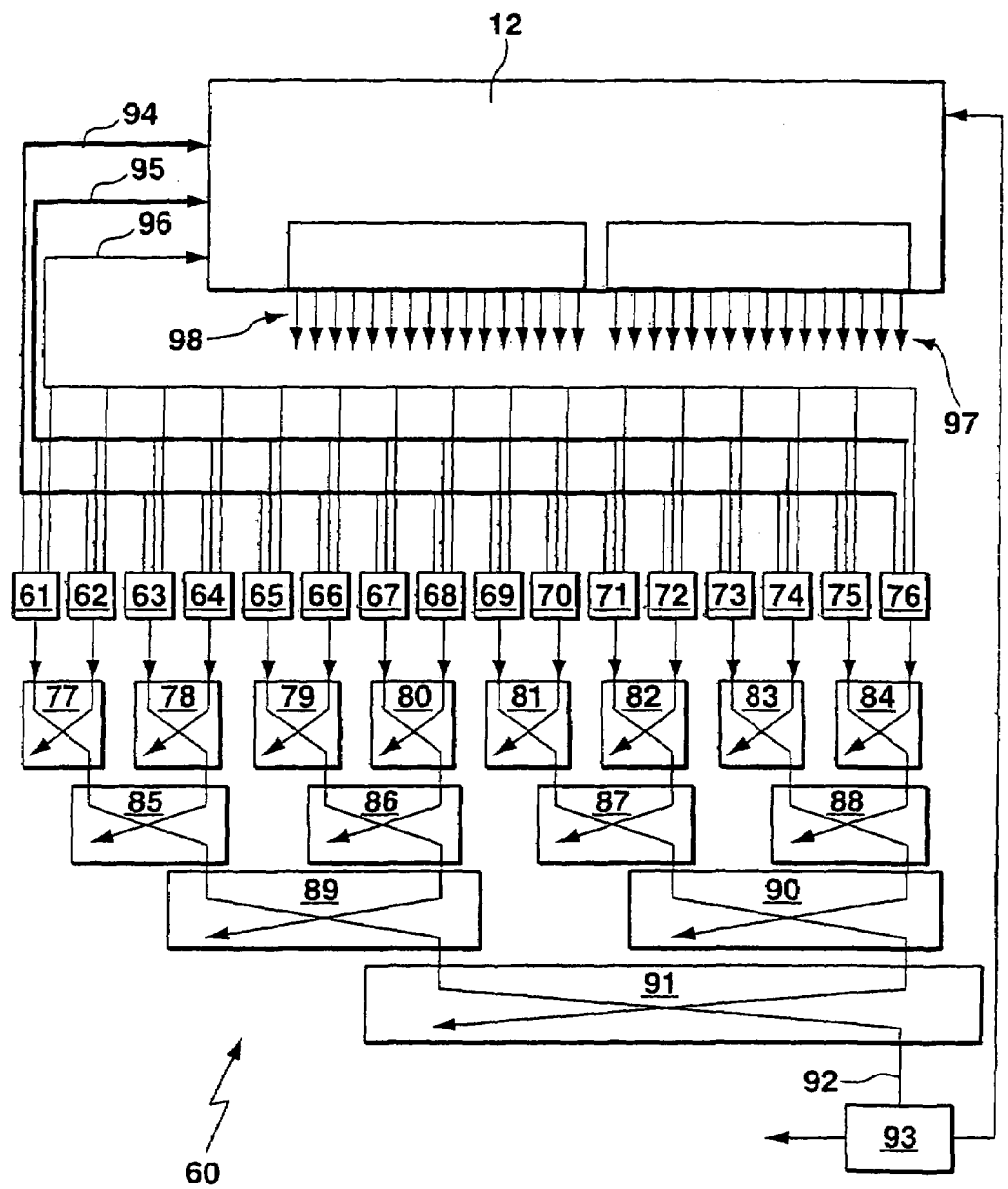
FIG. 7 shows a diagram of part of a vacuum plasma generator including a 3 dB coupler network.

FIG. 7 shows part of a vacuum plasma generator 60. The vacuum plasma generator 60 includes a central open-loop and/or closed-loop control means 12. Sixteen modules 61 to 76 are connected to the open-loop and/or closed-loop control means 12. Each of the modules 61 to 76 contains one RF signal generator and one pulse shaping network. Two modules 61 to 76, respectively, are each connected to one 3 dB coupler 77 to 84. For example, modules 61 and 62 are connected to 3 dB coupler 77 and modules 63 and 64 are connected to 3 dB coupler 78. In a subsequent stage, two 3 dB couplers 77 to 84 are connected to one 3 dB coupler 85 to 88, in each case. In a third stage, two 3 dB couplers 89, 90 are provided and in a fourth stage one 3 dB coupler 91 is provided. The RF power that can be supplied to the vacuum chamber 17 is applied at the output 92 of the 3 dB coupler 91. This power is detected by a measuring means 93 and is transferred to the closed-loop and/or open-loop control means 12. The closed-loop and/or open-loop control means 12 is connected for data exchange to the modules 61 to 76 through data lines 94 for analog signals, to an interface 95, and to an error message line 96. The closed-loop and/or open-loop control means 12 moreover includes sixteen synchronous clock outputs 97, with each output being supplied to one module 61 to 76. The RF signal generators of the modules 61-76 are clocked at a basic frequency through these outputs 97. The signals of the clock outputs 97 are not in-phase, which permits setting of the phase position of the output signals of the modules 61 to 76. The closed-loop and/or open-loop control means 12 moreover includes sixteen synchronous pulse outputs 98. The pulse outputs 98 are used in case the RF output signal of the vacuum plasma generator 60 is to be applied in a pulsed instead of a continuous form.

Figure 8:
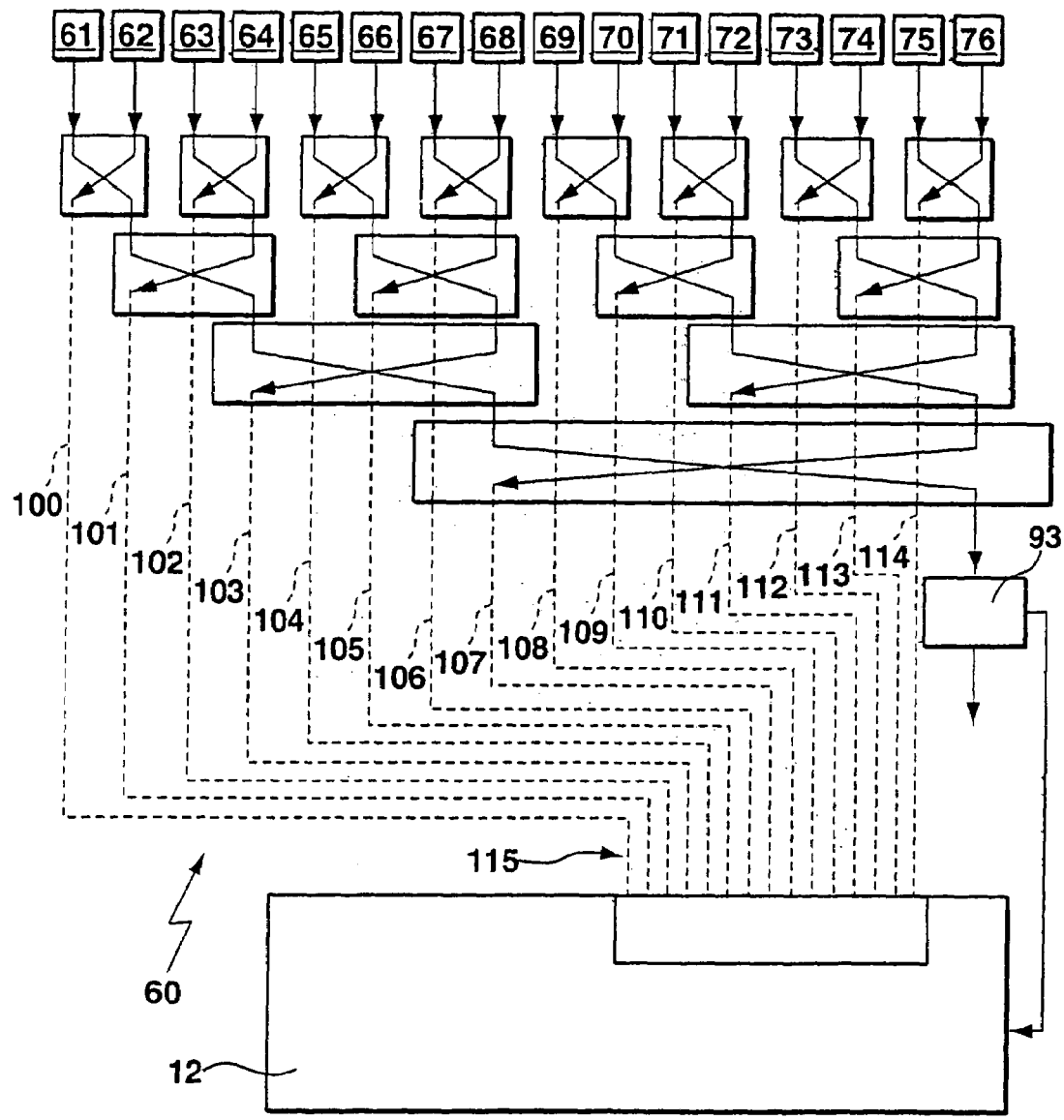
FIG. 8 shows a diagram of part of the vacuum plasma generator with a 3 dB coupler network.

FIG. 8 shows another part of the vacuum plasma generator 60. Load compensation resistances (not shown) are disposed at outputs 100 to 114 of the 3 dB couplers 77 to 91, respectively. The voltages present at the load compensation resistances are transmitted to the closed-loop and/or open-loop control means 12 through fifteen analog inputs 115. The voltages detected in this manner are a measure for impedance matching, the phase position of the signals of the RF signal generators with respect to each other, and power symmetry of the signals of the RF signal generators with respect to each other. They can be further used for closed-loop control of the vacuum plasma generator 60.

Figure 9A:
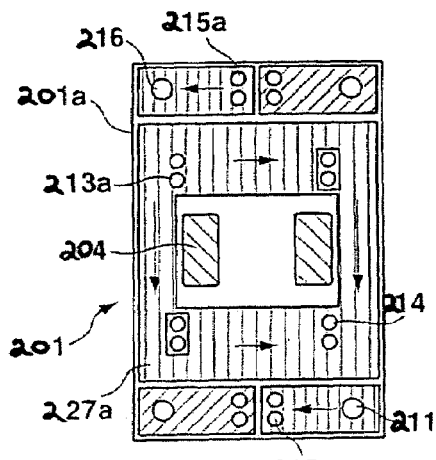
FIGS. 9a and 9b show diagrams of an upper side and a lower side, respectively, of a first circuit board that is part of a 3 dB coupler that can be used in the vacuum plasma generator of FIGS. 1-8.
Figure 9B:
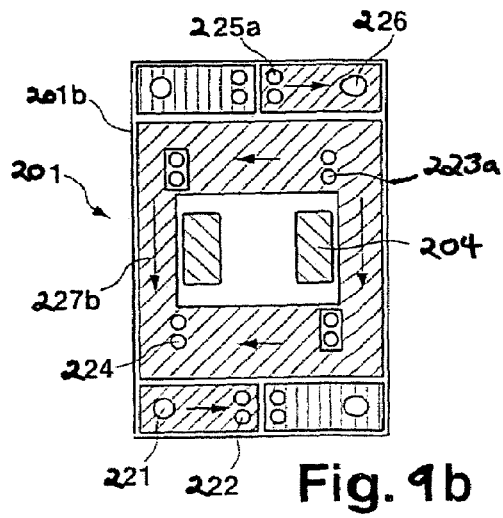
Figure 10A:
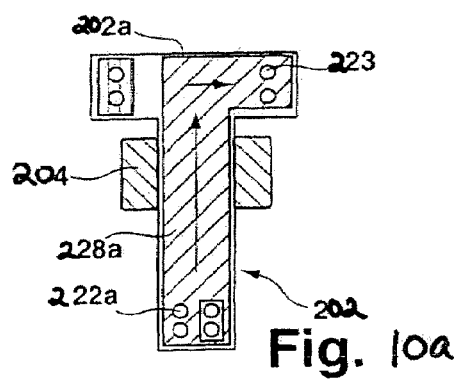
FIGS. 10a and 10b show diagrams of an upper side and a lower side, respectively, of a second circuit board to be disposed above the first circuit board of FIGS. 9a and 9b and being a part of a 3 dB coupler that can be used in the vacuum plasma generator of FIGS. 1-8.
Figure 10B:
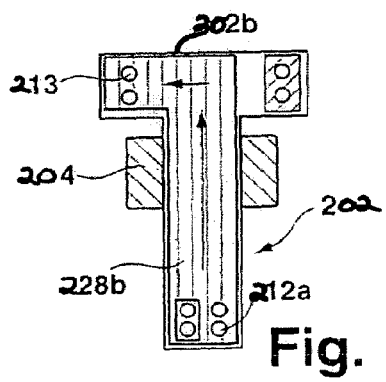
Figure 11A:
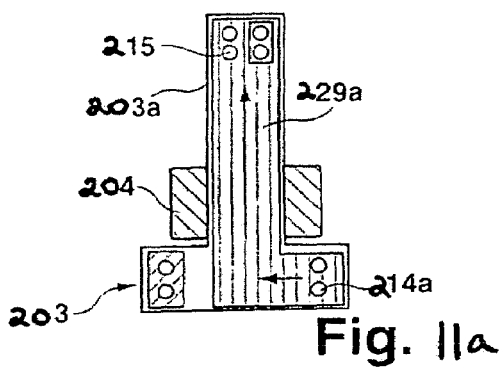
FIGS. 11a and 11b show diagrams of an upper side and a lower side, respectively, of a third circuit board to be disposed above the second circuit board of FIGS. 10a and 1b and being a part of the 3 dB coupler that can be used in the vacuum plasma generator of FIGS. 1-8.
Figure 11B:
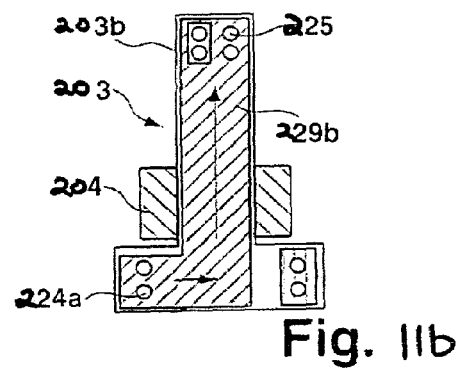

Referring to FIGS. 9a-11b and 12, in one implementation, the 3 dB coupler 200 includes a first circuit board 201, a second circuit board 202, and a third circuit board 203. FIGS. 9a, 9b show an upper side 201a and a lower side 201b, respectively, of the first circuit board 201. FIGS. 10a, 10b show an upper side 202a and a lower side 202b, respectively, of the second circuit board 202. FIGS. 11a, 11b show an upper side 203a and a lower side 203b, respectively, of the third circuit board 203. In general, the 3 dB coupler 200 includes at least one first and one second electric conductor that are spaced apart from each other, and are capacitively and inductively coupled to each other. The first electric conductor represents the primary side, and the second electric conductor represents the secondary side of a transformer.

Connections 211, 216, 221, 226 of the circuit board 201 are the inputs and outputs (ports) of the 3 dB coupler 200. Connections 212 and 212a are congruent when the circuit boards 201 and 202 are disposed on top of each other, and are connected in an electrically conducting manner when the 3 dB coupler 200 is assembled. Additionally, connections 213, 213a; 214, 214a; 215, 215a; 222, 222a; 223, 223a; 224, 224a and 225, 225a are congruent with each other in the same manner as the connections 212 and 212a.

The 3 dB coupler 200 includes a transformer having a primary side and a secondary side. The inductance of the primary side (shown as perpendicular hatched surfaces in FIGS. 9a-11b) includes two windings that extend through an inductance increasing element 204, which is formed as ferrite. The path of the two windings of the primary side is explained by reference numerals and arrows in FIGS. 9a-12b. The primary side inductance extends from the connection 211 to the connection 212, further to the connection 212a, to the connection 213, to the connection 213a, to the connection 214, to the connection 214a, to the connection 215, then to the connection 215a, and finally to the connection 216.

The inductance of the secondary side (shown as inclined hatched surfaces in FIGS. 9a-12b) also extends in two windings through the inductance increasing element 204, i.e., from the connection 221 to the connection 222, further to the connection 222a, then to the connection 223, to the connection 223a, to the connection 224, to the connection 224a, further to the connection 225, to the connection 225a, and finally to the connection 226.

In the 3 dB coupler 200, the circuit board 202 is disposed on the circuit board 201 and the circuit board 203 is disposed on the circuit board 202. The capacitance is thus formed substantially only between the conducting surfaces of the upper side 201a, 202a, 203a and the lower side 201b, 202b, 203b of one circuit board 201, 202, 203, respectively. The upper side 201a of the circuit board 201 and the lower side 202b of the circuit board 202 have strip conductors 227a, 228b of the same inductance and the upper side 202a of the circuit board 202 and the lower side 203b of the circuit board 203 have strip conductors 228a, 229b of the other inductance. Since a voltage is formed over the inductance, the circuit boards 201, 202, 203 are separated from each other, for example, through spacers, such as insulating plates or sheets. The overall arrangement of the three circuit boards 201, 202, 203 can also be integrated into a multi-layer (in the present case six layers) circuit board that permits more precise production at lower cost. The inductance increasing elements 4 are inserted in the form of two semi-shells.

The 3 dB coupler 200 can thereby be formed to combine two times 2.5 kW RF power at 13.56 MHz at 5 kW with dimensions of a length of 10 cm and a width of 5 cm (circuit board 201) and 4 cm height (determined by the inductance increasing element 204 designed as ferrite ring).

If the capacitance is to be matched or increased, a discrete capacitor can be connected in parallel, or the surface on both sides, for example, on the circuit board 201 can be increased.

Figure 12:
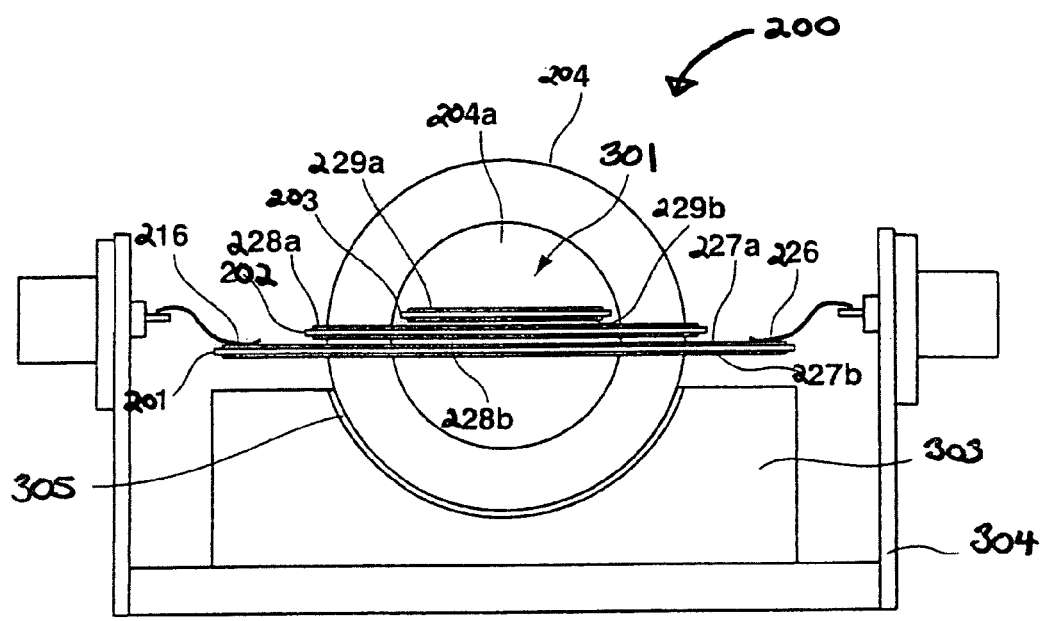
FIG. 12 shows a diagram of a front view of an implementation of a 3 dB coupler that can be used in the vacuum plasma generator of FIGS. 1-8.

In FIG. 12, the connections 216, 226 are shown. The circuit boards 202, 203 are disposed above the circuit board 201, wherein the T-shaped circuit boards 202, 203 are inserted into a space 204a of the inductance increasing element 204. This means that a coupling region 301 is surrounded by the inductance increasing element 204. The circuit boards 201, 202, 203 have strip conductors 227a, 227b, 228a, 228b, 229a, 229b on their upper sides 201a, 202a, 203a and their lower sides 201b, 202b, 203b. The strip conductors 227a, 227b, 228a, 228b, 229a, 229b on different sides of the circuit board 201, 202, 203 are separated by the carrier material of the circuit board 201, 202, 203. The carrier material is an insulator and serves as spacer. The opposing strip conductor sections of neighboring circuit boards 201, 202, 203 are separated by spacers. The inductance increasing element 204 is disposed on a cooling body 303, which is in turn seated on a carrier plate 304. A layer 305 that improves the thermal conductance is disposed between the cooling body 303 and the inductance increasing element 204.

Figure 13:
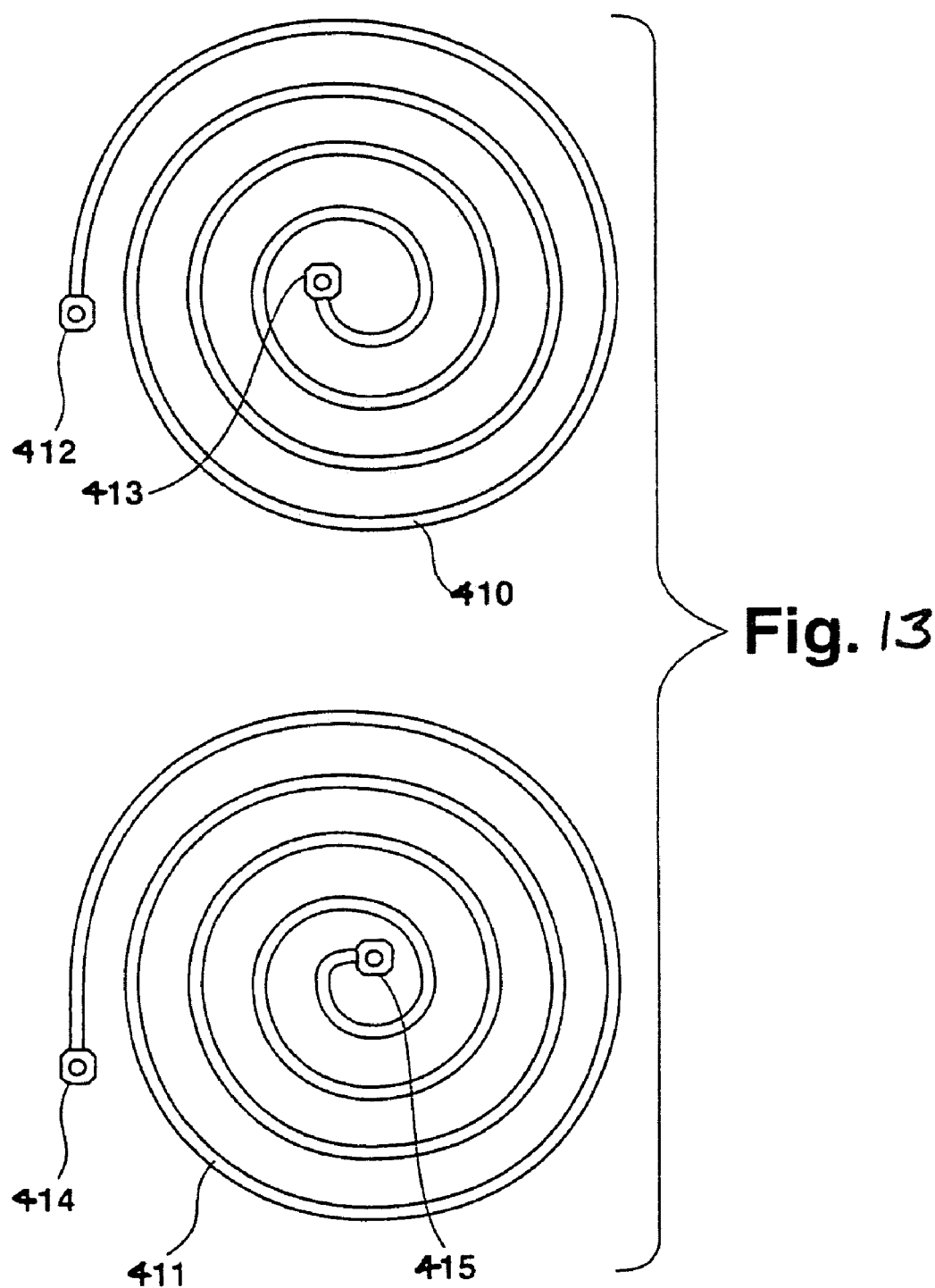
FIG. 13 shows a diagram of another implementation of a 3 dB coupler that can be used in the vacuum plasma generator of FIGS. 1-8.

Referring to FIG. 13, an implementation of a 3 dB coupler does not include an inductance increasing element. The conductors 410, 411 designed as strip conductors are formed as spirals. The spirals of conducting material are disposed, for example, laminated, on both sides of a circuit board. A conductor 410 is thereby disposed on the upper side and a conductor 411 is disposed on the lower side of the circuit board to largely coincide. The conductors 410, 411 represent, respectively, the inductances of the primary side and the secondary side of a transformer of a 3 dB coupler. They have a winding number of n=4 each.

When the connections 412-415 are desired in the form of through connections, they are offset, as shown in FIG. 13. It is, however, also feasible to form the connections 412-415 both on the upper and lower side of the circuit board, and to dispose the 3 dB coupler, for example, between two amplifiers.

In this case, it is also possible to use an inductance increasing element made of, for example, a ferrite, for example in the form of a disc, pin or shell core. If necessary, a recess, for example a bore for a ferrite must be provided in the center of the spiral.

Other implementations are within the scope of the following claims.

For example, the length of the at least one first and/or second conductor of the 3 dB coupler is $<\lambda/4$, preferably $<\lambda/8$, with particular preference $<\lambda/10$, where $\lambda$ is a wavelength of the RF signal. With these values, the transmission line theory of radio-frequency technology is no longer important. The coupling between the electric conductors corresponds to a capacitive coupling with a fixed given and adjusted capacitance between the conductors with predetermined basic frequency f and predetermined characteristic wave impedance $Z_0$. The capacitance may be adjusted by adjusting the surface and the separation between the conductors. The coupling moreover corresponds to an inductive coupling with a fixed given and adjusted inductance of the transformer with predetermined basic frequency f and predetermined characteristic wave impedance $Z_0$. The inductance is adjusted, for example, in dependence on the length of the conductors, in particular, of the conductor sections. In one implementation, at least one inductance increasing element is provided in the coupling region to increase the inductance of the conductors.

In one implementation, the dimensions of the 3 dB coupler as a unit are smaller than $\lambda/10$. In another implementation, the 3 dB coupler is smaller than 20 cm×10 cm×10 cm at frequencies between 1 and 30 MHz and powers of up to 12 kW, which permits integration of the 3 dB coupler in currently conventional small housing shapes of the vacuum plasma generators.

What is claimed is:

1. A vacuum plasma generator for treating workpieces in a vacuum chamber, the vacuum plasma generator comprising:
   a mains connection for connection to a voltage supply network; and
   at least one mains rectifier that is connected to:
      at least one first converter that generates at least one intermediate circuit voltage;
      a first RF signal generator that is connected to at least one intermediate circuit voltage of the at least one first converter, and that generates a first signal of a basic frequency and of a first phase position;
      a second RF signal generator that is connected to at least one intermediate circuit voltage of the at least one first converter, and that generates a second signal of the basic frequency and of a second phase position; and
      at least one 3 dB coupler that couples the first and the second signal and generates an output signal.

2. The vacuum plasma generator of claim 1, wherein the first RF signal generator and the second RF signal generator are connected to the same intermediate circuit voltage of the at least one first converter.

3. The vacuum plasma generator of claim 1, wherein the first and second RF signal generators are each designed as inverters that are driven by a control means.

4. The vacuum plasma generator of claim 3, wherein the control means is open-loop, closed-loop, or both open-loop and closed-loop.

5. The vacuum plasma generator of claim 3, wherein each inverter includes a half-bridge or a full bridge.

6. The vacuum plasma generator of claim 1, further comprising at least one capacitor for galvanic decoupling.

7. The vacuum plasma generator of claim 1, further comprising a pulse shaping network that is connected downstream of each of the first and second RF signal generators.

8. The vacuum plasma generator of claim 1, wherein:
the 3 dB coupler comprises at least one first and one second electric conductor that are spaced apart and are capacitively and inductively coupled to each other,
the first conductor represents the primary side of a transformer and the second conductor represents the secondary side of a transformer, and
the first and second conductors each having a winding number of n>1.

9. The vacuum plasma generator of claim 8, wherein a length of the at least one first and/or one second conductor is <$\lambda$/4, where $\lambda$ is the wavelength of the RF signal.

10. The vacuum plasma generator of claim 1, wherein:
the 3 dB coupler comprises at least one first and one second electric conductor that are spaced apart, and are capacitively and inductively coupled to each other,
the first conductor represents the primary side of a transformer and the second conductor represents the secondary side of a transformer, and
at least one inductance increasing element is provided in a coupling region to increase the inductance of the conductors.

11. The vacuum plasma generator of claim 9, wherein a length of the at least one first and/or second conductor is <$\lambda$/4, where $\lambda$ is the wavelength of the RF signal.

12. The vacuum plasma generator of claim 1, wherein the 3 dB coupler has a characteristic wave impedance of <50 ohms.

13. The vacuum plasma generator of claim 1, wherein the 3 dB coupler has a characteristic wave impedance of <20 ohms.

14. The vacuum plasma generator of claim 1, wherein at least two converters are provided to generate intermediate circuit voltages, wherein each converter is associated with at least one RF signal generator.

15. The vacuum plasma generator of claim 1, further comprising a control means, wherein the at least one converter comprises an input connected to the control means.

16. The vacuum plasma generator of claim 15, wherein the control means is open-loop, closed-loop, or both open-loop and closed-loop.

17. The vacuum plasma generator of claim 15, wherein the control means is designed as a programmable logic component.

18. The vacuum plasma generator of claim 15, wherein the control means is a digital signal processor.

19. The vacuum plasma generator of claim 1, further comprising an impedance matching circuit that adjusts the impedance of the generator to a plasma load.

20. The vacuum plasma generator of claim 1, wherein the at least one converter is designed as a boost converter, a buck converter, or both a boost and a buck converter.

21. The vacuum plasma generator of claim 1, wherein the first RF signal generator generates a first signal of the basic frequency in the range between 1 and 30 MHz.

22. A vacuum plasma generator for treating workpieces in a vacuum chamber, the vacuum plasma generator comprising:
a mains connection coupled to a voltage supply network;
at least one mains rectifier connected to the mains connection;
at least one first converter connected to the mains rectifier and generating at least one intermediate circuit voltage;
a first RF signal generator that is connected to at least one intermediate circuit voltage of the at least one first converter, and that generates a first signal of a basic frequency, and of a first phase position;
a second RF signal generator that is connected to at least one intermediate circuit voltage of the at least one first converter, and that generates a second signal of the basic frequency, and of a second phase position; and
at least one 3 dB coupler that couples the first and the second signal and generates an output signal.

23. The vacuum plasma generator of claim 22, wherein the first RF signal generator and the second RF signal generator are connected to the same intermediate circuit voltage of the at least one first converter.

* * * * *